US012709673B2

(12) United States Patent
Guhathakurta et al.

(10) Patent No.: US 12,709,673 B2
(45) Date of Patent: Aug. 18, 2026

(54) POLYOLEFIN BASED PIEZOELECTRIC POLYMER COMPOSITE

(71) Applicant: SABIC Global Technologies B.V., Bergen op Zoom (NL)

(72) Inventors: Soma Guhathakurta, Bengaluru (IN); Theodorus Lambertus Hoeks, Bengaluru (IN); Suresh Velate, Bengaluru (IN)

(73) Assignee: SABIC Global Technologies B.V., Bergen op Zoom (NL)

( * ) Notice: Subject to any disclaimer, the term of this patent is extended or adjusted under 35 U.S.C. 154(b) by 686 days.

(21) Appl. No.: 18/006,253

(22) PCT Filed: Aug. 20, 2021

(86) PCT No.: PCT/EP2021/073130

§ 371 (c)(1),
(2) Date: Jan. 20, 2023

(87) PCT Pub. No.: WO2022/043206

PCT Pub. Date: Mar. 3, 2022

(65) Prior Publication Data

US 2023/0323077 A1 Oct. 12, 2023

(30) Foreign Application Priority Data

Aug. 22, 2020 (IN) ............................ 202041036211

(51) Int. Cl.
*H10N 30/85* (2023.01)
*C08K 3/22* (2006.01)
(Continued)

(52) U.S. Cl.
CPC ................ *C08K 3/22* (2013.01); *C08K 3/346* (2013.01); *H10N 30/092* (2023.02);
(Continued)

(58) Field of Classification Search
CPC ............. C08K 3/22; C08K 2003/2234; C08K 2003/2237; C08K 2003/2206; C08K 2003/2244; H10N 30/092; H10N 30/852
(Continued)

(56) References Cited

U.S. PATENT DOCUMENTS 5,951,908 A 9/1999 Cui et al.
2015/0134061 A1 5/2015 Friis et al.
(Continued)

FOREIGN PATENT DOCUMENTS

CN 103865166 A 6/2014
CN 104558804 A 4/2015
(Continued)

OTHER PUBLICATIONS

Foreign communication from related application—International Search Report and Written Opinion dated Dec. 2, 2021 for application No. PCT/EP2021/073130 filed Aug. 20, 2021, 13 pages.
(Continued)

*Primary Examiner* — Ruiyun Zhang
(74) *Attorney, Agent, or Firm* — Fish & Richardson P.C.

(57) ABSTRACT

A piezoelectric composite comprising (a) an olefin copolymer and (b) a plurality of piezoelectric filler particles is disclosed. Each of the plurality of piezoelectric filler particles can be dispersed in the olefin copolymer. Also disclosed are films containing such piezoelectric composites and methods of preparing such films.

13 Claims, 4 Drawing Sheets

Polymer-ceramic piezoelectric composite according to embodiments of the disclosure.

(51) Int. Cl.
*C08K 3/34* (2006.01)
*H10N 30/092* (2023.01)

(52) U.S. Cl.
CPC ... *H10N 30/852* (2023.02); *C08K 2003/2206* (2013.01); *C08K 2003/2234* (2013.01); *C08K 2003/2237* (2013.01); *C08K 2003/2244* (2013.01)

(58) Field of Classification Search
USPC .......................................................... 524/435
See application file for complete search history.

(56) References Cited

U.S. PATENT DOCUMENTS

| | | | |
|---|---|---|---|
| 2017/0018700 | A1 | 1/2017 | Miyoshi et al. |
| 2019/0334078 | A1 | 10/2019 | Silva et al. |

FOREIGN PATENT DOCUMENTS

| | | | |
|---|---|---|---|
| CN | 104558805 | A | 4/2015 |
| CN | 107746557 | A | 3/2018 |
| EP | 1676886 | A1 | 7/2006 |
| FR | 3060857 | A1 | 6/2018 |
| JP | 2012052065 | A | 3/2012 |
| JP | 2014037451 | A | 2/2014 |
| WO | WO 2021228898 | | 11/2012 |
| WO | 2016157092 | A1 | 10/2016 |
| WO | 2016175538 | A1 | 11/2016 |
| WO | WO 2021228868 | | 11/2021 |

OTHER PUBLICATIONS

Foreign communication from related application—International Preliminary Report on Patentability dated Feb. 28, 2023 for application No. PCT/EP2021/073130 filed Aug. 20, 2021, 6 pages.

Vacche et al., "The effect of processing conditions on the morphology, thermomechanical, dielectric, and piezoelectric properties of P(VDF-TrFE)/BaTiO3 composites", Journal of Materials Science, (2012), 47, 4763-4774, DOI: 10.1007/s10853-012-6362-x, Published: Mar. 1, 2012, 13 pages.

Di Donato Marco, "Development of composite piezoelectric materials for tactile sensing", Doctoral thesis in Physics, (2015), Politecnico di Torino, Dipartimento di Scienza Applicata e Tecnologia, XXVII cycle, DOI: 10.6092/polito/porto/2591164, Published Feb. 2015, 97 pages.

Deutz et al., "Flexible Piezoelectric Touch Sensor by Alignment of Lead-Free Alkaline Niobate Microcubes in PDMS", Advanced Functional Materials, (2017), 27(24):1700728, DOI: 10.1002/adfm.201700728, Published Apr. 2017, 8 pages.

Chen et al., "0-3 Piezoelectric composite film with high d33 coefficient", Sensors and Actuators A: Physical, (1998), vol. 65, Issues 2-3, pp. 194-196, DOI: 10.1016/S0924-4247(97)01685-3, Published Jul. 27, 1998, 3 pages.

Topolov et al., "High-performance 1-3-type lead-free piezocomposites with auxetic polyethylene matrices", Materials Letters, vol. 142, (2015), pp. 265-268, DOI: 10.1016/j.matlet.2014.12.018, Published Dec. 10, 2014, 4 pages.

Hu et al., "Dielectric Properties of BST/Polymer Composite", Journal of the European Ceramic Society, Elsevier, Amsterdam, NL, vol. 27, Issues 13-15, (2007), pp. 3997-4001, ISSN: 0955-2219, DOI: 10.1016/j.jeurceramsoc.2007.02.082, Published Mar. 23, 2007, 5 pages.

JP office action issued on Aug. 7, 2025 for the patent Application No. 2023-512717 dated Feb. 21, 2023, 6 pages.

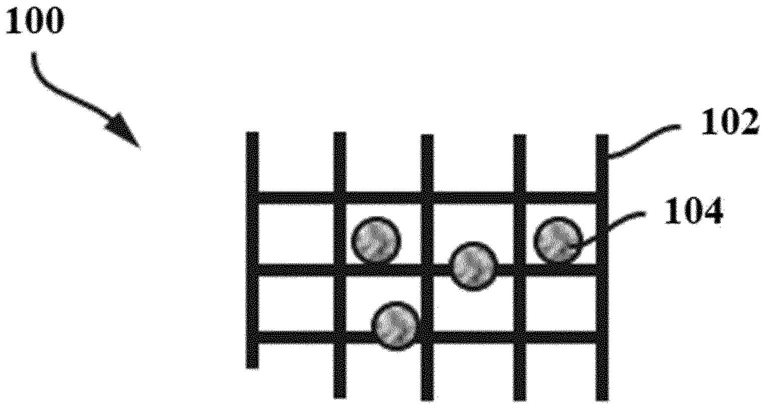
FIG. 1. Polymer-ceramic piezoelectric composite according to embodiments of the disclosure.

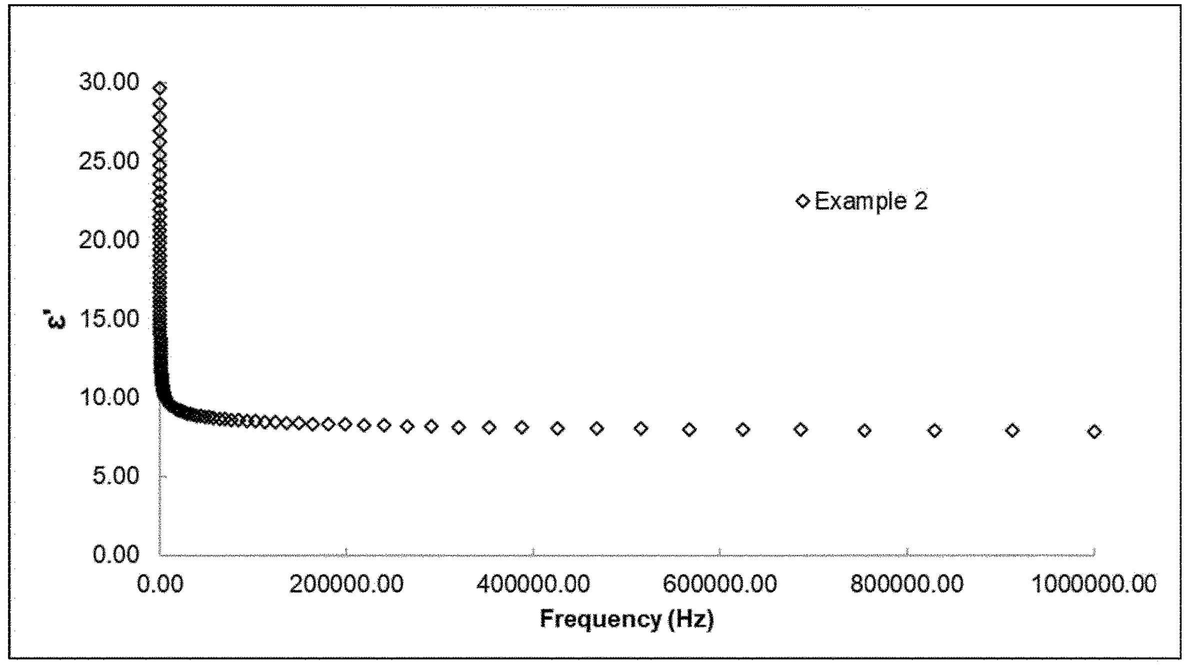
FIG. 2. Dielectric constant as a function of frequency of piezoelectric polymer composite

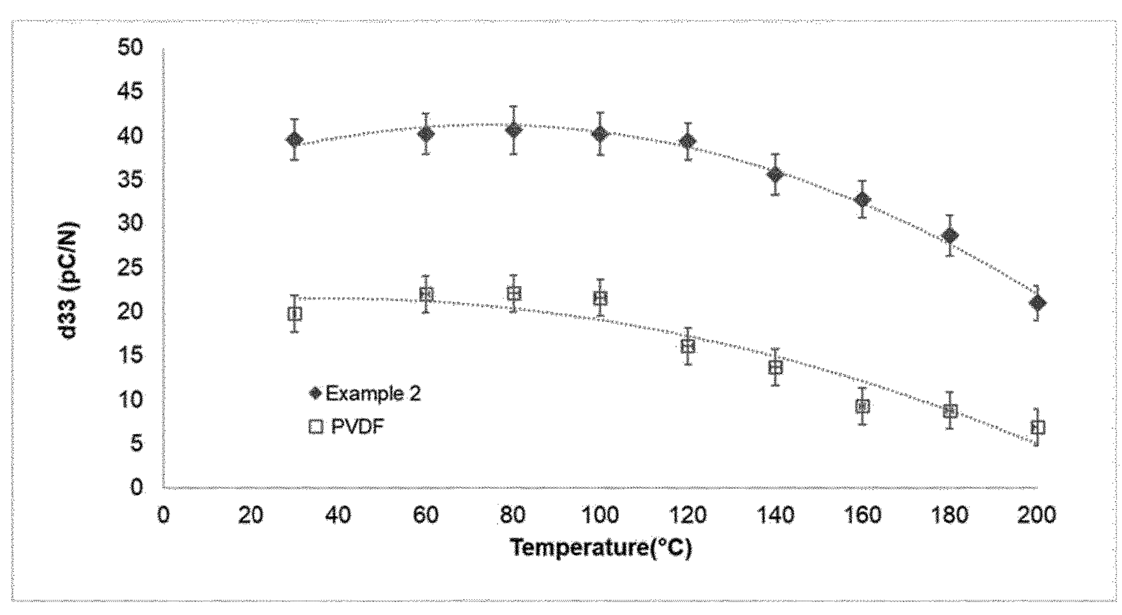
FIG. 3a. Effect of temperature on piezoelectric strain constant for poled PVDF and Example 2 (poled)
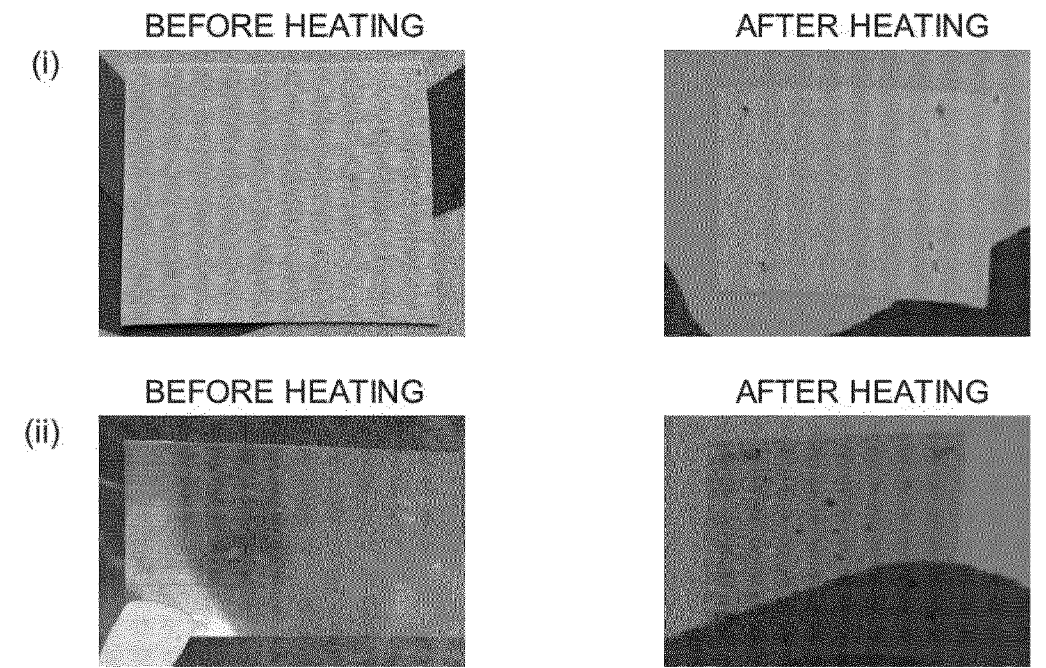
FIG. 3b. Effect of temperature on physical appearance of films before and after heating; (i) Example 2, (ii) PVDF

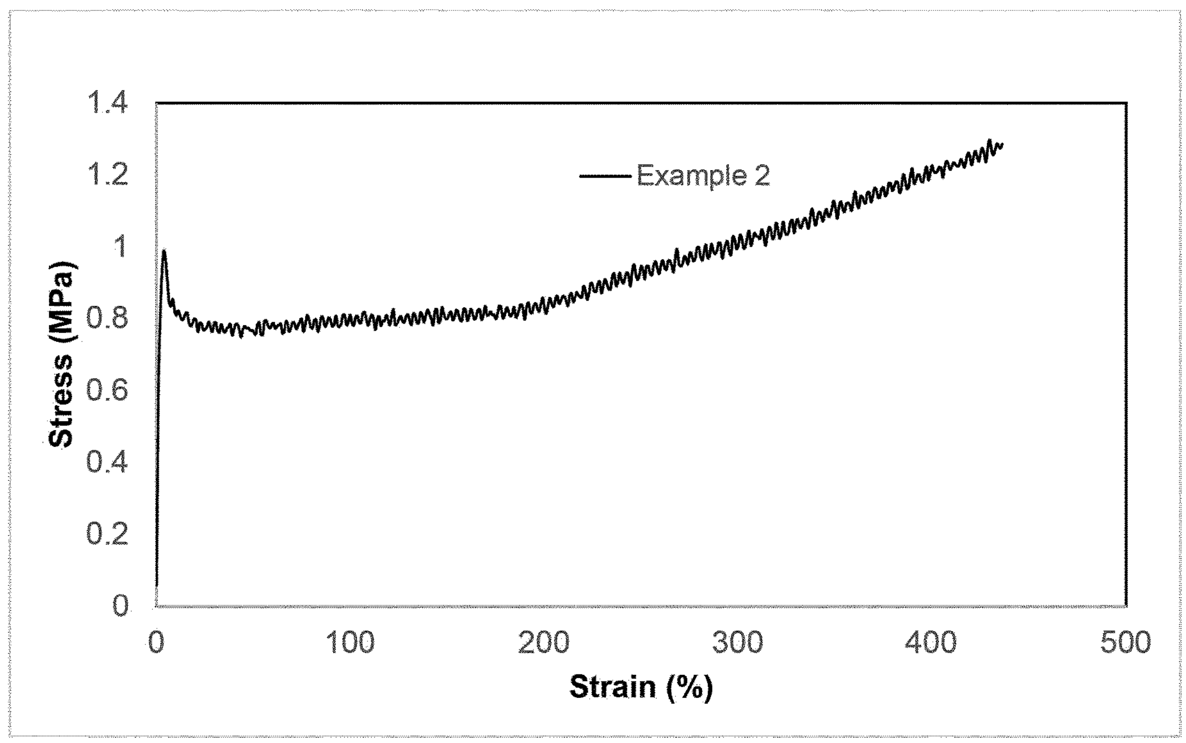
FIG. 4. Tensile stress-strain plot of piezoelectric polymer composite

POLYOLEFIN BASED PIEZOELECTRIC POLYMER COMPOSITE

CROSS REFERENCE TO RELATED APPLICATIONS

This application is a National Stage Application under 35 U.S.C. § 371 and claims the benefit of International Application No. PCT/EP2021/073130, filed Aug. 20, 2021, which claims the benefit of priority of Indian Application No. IN202041036211, filed Aug. 22, 2020, the entirety of both of which are incorporated herein by reference. None.

TECHNICAL FIELD

The present disclosure is directed to the field of piezoelectric polymer composites, and in some embodiments to flexible films containing such piezoelectric polymer composites.

BACKGROUND

Conventional wearable devices use eccentric rotating mass (ERM) and linear resonant actuators (LRA) to create vibrations for receiving user input and/or providing feedback. However, the inclusion of ERM and LRA in such devices render these devices bulky and impact device mechanical flexibility. Wearables and other devices may benefit from mechanical flexibility and/or operation at low voltage.

Piezoelectric devices have been considered as alternatives to overcome the drawbacks associated with ERMs and LRAs. Some piezoelectric materials considered include ceramics, single crystalline piezoelectric, and polymeric piezoelectric materials. Ceramics may have relatively high piezoelectric strain constant as compared to polymers and are particularly suitable for actuators. However, ceramics suffer from high acoustic impedance and/or poor electromechanical resonances, which results in poor acoustic matching and a high degree of background noise. In addition, ceramics may exhibit a high degree of stiffness and brittleness such that they cannot be formed onto curved surfaces, which contributes to limited design flexibility in a transducer. Single crystal piezoelectric material, such as crystals of quartz, tourmaline or potassium-sodium tartrate, have been attempted, but, as with ceramics, any one single piezoelectric material does not provide all of the desired features for an application, and the performance is thereby limited by the trade-off between high piezoelectric activity and low mechanical flexibility. Piezoelectric polymer materials such as polyvinylidene fluoride (PVDF) and polyvinylidene fluoride—triflouroethylene (PVDF-TrFE) copolymer offer several advantages, which include mechanical flexibility, light weight, and easy low temperature processing. These polymer materials are suitable for design and integration in a device. Despite such advantages, these polymeric materials typically suffer from drawbacks associated with their low piezoelectric charge constant ($d_{33}$ ~13-28 pC/N) compared to the ceramics ($d_{33}$ of lead zirconate titanate (PZT) ranges from 270-400 pC/N) and the requirement of higher driving voltage, thereby posing additional safety and cost concerns. In addition, with PVDF, secondary processing is required to form the piezo active beta-PVDF, adding to both operational and capital expenditure and limiting their potential. In particular, the overall cost of production involving PVDF polymers hampers extensive commercial application and a need for developing a cost effective piezoelectric polymer solution remains. Further, use, disposal, and recycling of halogenated polymers such as PVDF are subjected to environmental regulations.

Piezoelectric polymer composites represent a new class of material containing a polymer and a piezoelectric filler, and effectively combines the advantages of both the types of materials, the high piezoelectric strain constant of ceramics (a suitable piezoelectric filler) with the high piezoelectric voltage constant and mechanical flexibility of polymers. Such materials can be suitably tailored according to the property, design or functional requirements for an intended application.

Shortcomings mentioned here are only representative and are included to highlight problems that the inventors have identified with respect to existing piezoelectric materials. Aspects of piezoelectric materials described below may address some or all of the shortcomings as well as others known in the art.

BRIEF SUMMARY

Piezoelectric composites are disclosed herein that provide cost-effective materials and films having one or more benefits of ease of processability, excellent piezoelectric characteristics, flexibility, and other mechanical properties. High performing piezoelectric materials are desirable for sensors, actuators, and energy harvesters in healthcare and biomedical applications and wearable electronics.

The piezoelectric composite may comprise an olefin copolymer. As used herein, the expression "olefin copolymer" refers to copolymers comprising a first monomer of ethylene or propylene, polymerized with any of 1-butene, 4-methyl-1-pentene, 1-hexene, 1-octene, 1-decene, 1-dodecene, 1-tetradecene, 1-hexadecene, 1-octadecene and 1-eicosene. A preferred embodiment could be comprised of ethylene and octene. Olefin copolymers may include an olefin block copolymer, olefin random copolymer, or some mixture of the two.

The piezoelectric composite comprises a plurality of piezoelectric filler particles dispersed in the olefin copolymer. The olefin copolymer may be present in an amount ranging from 20-80 vol. %, with regard to the total volume of the piezoelectric composite. The plurality of piezoelectric filler particles may be present in an amount ranging from 20-80 vol. %, with regard to the total volume of the piezoelectric composite. The olefin copolymer may comprise from 10 to 40 wt. % octene in the copolymer. The olefin copolymer may be,

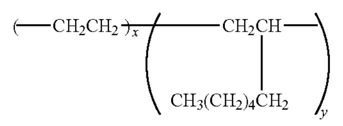

The piezoelectric composite may further comprise a second polymer, wherein the second polymer comprise at least one of polyethylene, polypropylene, ethylene copolymer, propylene copolymer, polyethylene terephthalate (PET), polycarbonate (PC), polybutylene terephthalate (PBT), poly (41,-cyclohexylidene cyclohexane-41,-dicarboxylate) (PCCD), glycol modified polycyclohexyl terephthalate (PCTG), poly(phenylene oxide) (PPO), polypropylene (PP), polyethylene (PE), polyvinyl chloride (PVC), polystyrene (PS), polymethyl methacrylate (PMMA), polyethyleneimine or polyetherimide (PEI) and their derivatives, thermoplastic elastomer (TPE), terephthalic acid (TPA) elastomers, poly (cyclohexanedimethylene terephthalate) (PCT), polyethylene naphthalate (PEN), polyamide (PA), polysulfone sulfonate (PSS), polyether ether ketone (PEEK), acrylonitrile butyldiene styrene (ABS), polyether ketone (PEKK), polyphenylene sulfide (PPS), co-polymers thereof, or blends thereof.

In the piezoelectric composite, the plurality of piezoelectric filler particles may comprise at least one of lead zirconate titanate (PZT), hydroxyapatite, apatite, lithium sulfate monohydrate, sodium bismuth titanate, quartz, tartaric acid fibers, poly(vinylidene fluoride) fibers, barium titanate, lithium doped potassium sodium niobate (KNLN) having the formula $(K,Na)_{(1-t)}Li_tNbO_3$ wherein the variable 't' ranges from greater than 0.01 to less than 1 ($0.01<t<1.00$), potassium sodium niobate $(K,NaNb)O_3$ (KNN), or combinations thereof. When the piezoelectric filler particles are KNLN, the particles comprise 40 vol. % to 60 vol. % of the composite.

The piezoelectric composites according to the disclosure may be made in different forms as per the need of an intended application. These may include pellets, flakes, powder, fiber, film and the like. A flexible film may comprise any of the piezoelectric composites listed above. The film may have a piezoelectric charge constant ($d_{33}$ (pC/N)) ranging from about 6 to about 100, more preferably from about 20 to about 50. The film may have a g33 of ~100-300 mV*m/N. The film may have an elongation at break (%) ranging from about 20 to 800. The film may have a thickness ranging from about 50 microns to about 500 microns.

A method of preparing the film described above may comprise the steps of: dissolving an olefin copolymer in an organic solvent and forming an olefin copolymer solution, the olefin copolymer comprising a first monomer of ethylene or propylene, polymerized with any of 1-butene, 4-methyl-1-pentene,1-hexene, 1-octene, 1-decene, 1-dodecene, 1-tetradecene, 1-hexadecene, 1-octadecene and 1-eicosene; adding a plurality of piezoelectric filler particles to the olefin copolymer solution and forming a film precursor; forming a casted film precursor from the film precursor; and poling the casted film precursor. The casted film precursor may be annealed prior to poling. The casted film precursor may be poled in an electric field ranging from about 5 kV/mm to about 100 kV/mm for a time period ranging from about 1 minute to about 120 minutes and at a temperature ranging from about 60 degrees Celsius to about 120 degrees Celsius. The olefin copolymer is preferably ethylene-octene copolymer.

Also disclosed in the context of the present disclosure are aspects 1-19. Aspect 1 is a piezoelectric composite, comprising: an olefin copolymer comprising a first monomer of ethylene or propylene, polymerized with any of 1-butene, 4-methyl-1-pentene,1-hexene, 1-octene, 1-decene, 1-dodecene, 1-tetradecene, 1-hexadecene, 1-octadecene, and 1-eicosene; and a plurality of piezoelectric filler particles dispersed in the olefin copolymer. Aspect 2 is the piezoelectric composite of aspect 1, wherein the olefin copolymer is present in an amount ranging from 20-80 vol. %, with regard to the total volume of the piezoelectric composite. Aspect 3 is the piezoelectric composite of any one of aspects 1 to 2, wherein the plurality of piezoelectric filler particles is present in an amount ranging from 20-80 vol. %, with regard to the total volume of the piezoelectric composite. Aspect 4 is the piezoelectric composite of any one of aspects 1 to 3, wherein the olefin copolymer is an ethylene-octene copolymer represented by the general formula:

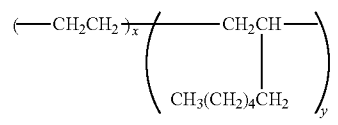

Aspect 5 is the piezoelectric composite of any one of aspects 1 to 4, wherein the ethylene-octene copolymer comprises from 10 to 40 wt. % octene. Aspect 6 is the piezoelectric composite of any one of aspects 1 to 5, further comprising at least one of polyethylene, polypropylene, ethylene copolymer, propylene copolymer, polyethylene terephthalate (PET), polycarbonate (PC), polybutylene terephthalate (PBT), poly(41,-cyclohexylidene cyclohexane-41,-dicarboxylate) (PCCD), glycol modified polycyclohexyl terephthalate (PCTG), poly(phenylene oxide) (PPO), polypropylene (PP), polyethylene (PE), polyvinyl chloride (PVC), polystyrene (PS), polymethyl methacrylate (PMMA), polyethyleneimine or polyetherimide (PEI) and their derivatives, thermoplastic elastomer (TPE), terephthalic acid (TPA) elastomers, poly(cyclohexanedimethylene terephthalate) (PCT), polyethylene naphthalate (PEN), polyamide (PA), polysulfone sulfonate (PSS), polyether ether ketone (PEEK), acrylonitrile butyldiene styrene (ABS), polyether ketone ketone (PEKK), polyphenylene sulfide (PPS), co-polymers thereof, or blends thereof. Aspect 7 is the piezoelectric composite of any one of aspects 1 to 6, wherein the plurality of piezoelectric filler particles comprise at least one of lead zirconate titanate (PZT), hydroxyapatite, apatite, lithium sulfate monohydrate, sodium bismuth titanate, quartz, tartaric acid fibers, poly(vinylidene fluoride) fibers, barium titanate, lithium doped potassium sodium niobate (KNLN) having the formula $(K,Na)_{1-t}Li_tNbO_3$ wherein the variable 't' ranges from greater than 0.01 to less than 1 ($0.01<t<1.00$), potassium sodium niobate $(K,NaNb)O_3$ (KNN), or combinations thereof. Aspect 8 is the piezoelectric composite of any one of aspects 1 to 7, wherein the plurality of piezoelectric filler particles comprises about 40 vol % to about 60 vol % of KNLN, with regard to the total volume of the piezoelectric composite.

Aspect 9 is a film comprising the piezoelectric composite of any of aspects 1 to 8. Aspect 10 is the film of aspect 9, wherein the film has a piezoelectric charge constant ($d_{33}$ (pC/N)) ranging from about 6 to about 100. Aspect 11 is the film of any one of aspects 9 to 10, wherein the film has a piezoelectric charge constant (d33 (pC/N)) ranging from about 20 to about 50. Aspect 12 is the film of any one of aspects 9 to 11, wherein the piezoelectric voltage constant (g33 (mV·m/N) is ~100-300. Aspect 13 is the film of any one of aspects 9 to 12, wherein the film has a thickness ranging from about 50 microns to about 500 microns. Aspect 14 is the film of any one of aspects 9 to 13, wherein the film has elongation at break ranging from about 20% to about 800%. Aspect 15 is the film of any one of aspects 9 to 14, wherein the film is present in an article of manufacture.

Aspect 16 is a method of preparing the film of any one of claims 9 to 15, wherein the method comprises: dissolving an olefin copolymer in an organic solvent and forming an olefin copolymer solution, the olefin copolymer comprising a first monomer of ethylene or propylene, polymerized with any of 1-butene, 4-methyl-1-pentene,1-hexene, 1-octene, 1-decene, 1-dodecene, 1-tetradecene, 1-hexadecene, 1-octadecene and 1-eicosene; adding a plurality of piezoelectric filler particles to the olefin copolymer solution and forming a film precursor; forming a casted film precursor from the film precursor; and poling the casted film precursor. Aspect 17 is the method of aspect 16, wherein the casted film precursor is annealed prior to poling. Aspect 18 is the method of any one of aspects 16 to 17, wherein the olefin copolymer is ethylene-octene copolymer. Aspect 19 is the method of any one of aspects 16 to 18, wherein the casted film precursor is poled at an electric field ranging from about 5 kV/mm to about 100 kV/mm for a time period ranging from about 1 minute to about 120 minutes and at a temperature ranging from about 60 degrees Celsius to about 120 degrees Celsius. The terms "about" or "approximately" are defined as being close to as understood by one of ordinary skill in the art. In one non-limiting embodiment, the terms are defined to be within 10%, preferably within 5%, more preferably within 1%, and most preferably within 0.5%.

The terms "wt. %", "vol. %" or "mol. %" refers to a weight, volume, or molar percentage of a component, respectively, based on the total weight, the total volume, or the total moles of the material that includes the component. In a non-limiting example, 10 moles of a component in 100 moles of the material means 10 mol. % of the component. The term "M" refers to a molar concentration of a component, based on the moles per 1 L volume. The term "mM" means one thousandth of an "M." Any numerical range used through this disclosure shall include all values and ranges there between unless specified otherwise. For example, a boiling point range of 50° C. to 100° C. includes all temperatures and ranges between 50° C. and 100° C. including the temperature of 50° C. and 100° C.

The use of the words "a" or "an" when used in conjunction with the term "comprising," "including," "containing," or "having" in the claims or the specification may mean "one," but it is also consistent with the meaning of "one or more," "at least one," and "one or more than one." The words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. The process of the present disclosure can "comprise", "consist essentially of," or "consist of" particular ingredients, components, compositions, etc., disclosed throughout the disclosure.

Other objects, features and advantages of the present disclosure will become apparent from the following figures, detailed description, and examples. It should be understood, however, that the figures, detailed description, and examples, while indicating specific embodiments of the disclosure, are given by way of illustration only and are not meant to be limiting. Additionally, it is contemplated that changes and modifications within the spirit and scope of the disclosure will become apparent to those skilled in the art from this detailed description. In further embodiments, features from specific embodiments may be combined with features from other embodiments. For example, features from one embodiment may be combined with features from any of the other embodiments. In further embodiments, additional features may be added to the specific embodiments described herein.

BRIEF DESCRIPTION OF THE DRAWINGS

For a more complete understanding, reference is now made to the following descriptions taken in conjunction with the accompanying drawings, in which:

FIG. 1 shows an illustration of a polymer-ceramic piezoelectric composite according to embodiments of the disclosure.

FIG. 2 is a graph of dielectric constant as a function of frequency of a piezoelectric polymer composite according to embodiments of the disclosure.

FIG. 3*a* is a graph of piezoelectric strain constant as a function of temperature of PVDF and a piezoelectric polymer composite according to embodiments of the disclosure.

FIG. 3*b* includes images of the physical appearance of PVDF and a piezoelectric polymer composite according to embodiments of the disclosure (before and after heating).

FIG. 4 is a graph of tensile stress-strain plot of a piezoelectric polymer composite according to embodiments of the disclosure.

DETAILED DESCRIPTION

FIG. 1 shows an illustration of a polymer-ceramic piezoelectric composite according to embodiments of the disclosure. A composite 100 includes a polymer matrix 102 and a piezoelectric ceramic filler 104 dispersed in the polymer matrix 102. The piezoelectric ceramic filler 104 may be in the form of particles and dispersed throughout the polymer matrix 102. The polymer matrix 102 may include olefin copolymer as described in more detail in the described embodiments below.

Olefin copolymer-based piezoelectric composites provide a unique solution to some of the challenges and limitations described above. The composite includes piezoelectric filler particles dispersed in the olefin copolymer. The olefin copolymer may be present in an amount ranging from 20 vol. % to 80 vol. %, alternatively from 30 vol. % to 70 vol. %, alternatively from 45 vol. % to 65 vol. %, or alternatively from 40 vol. % to 60 vol. %, or alternatively approximately 40 vol. % with regard to the total volume of the piezoelectric composite. The piezoelectric filler particles may be present in an amount ranging from 20 vol. % to 80 vol. %, alternatively from 30 vol. % to 70 vol. %, alternatively from 40 vol. % to 60 vol. %, or alternatively approximately 60 vol. % with regard to the total volume of the piezoelectric composite.

The expression "olefin copolymer" as used in this disclosure refers to copolymers comprising a first monomer of ethylene or propylene, polymerized with 1-butene, 4-methyl-1-pentene,1-hexene, 1-octene, 1-decene, 1-dodecene, 1-tetradecene, 1-hexadecene, 1-octadecene and 1-eicosene. A preferred embodiment could be comprised of ethylene and octene. The olefin copolymer may include an olefin block copolymer, an olefin random copolymer, or a mixture of the two.

In some embodiments, a second polymer to include in the polymer matrix is selected from polyethylene, polypropylene, ethylene copolymer, propylene copolymer, polyethylene terephthalate (PET), polycarbonate (PC), polybutylene terephthalate (PBT), poly(41,-cyclohexylidene cyclohexane-41,-dicarboxylate) (PCCD), glycol modified polycyclohexyl terephthalate (PCTG), poly(phenylene oxide) (PPO), polypropylene (PP), polyethylene (PE), polyvinyl chloride (PVC), polystyrene (PS), polymethyl methacrylate (PMMA), polyethyleneimine or polyetherimide (PEI) and their derivatives, thermoplastic elastomer (TPE), terephthalic acid (TPA) elastomers, poly(cyclohexanedimethylene terephthalate) (PCT), polyethylene naphthalate (PEN), polyamide (PA), polysulfone sulfonate (PSS), polyether ether ketone (PEEK), acrylonitrile butyldiene styrene (ABS), polyether ketone (PEKK), polyphenylene sulfide (PPS), co-polymers thereof, or blends thereof. In some preferred embodiments of the disclosure, the second polymer is polycarbonate (PC).

The plurality of piezoelectric filler particles may include particles of lead zirconate titanate (PZT), hydroxyapatite, apatite, lithium sulfate monohydrate, sodium bismuth titanate, quartz, tartaric acid fibers, poly(vinylidene fluoride) fibers, barium titanate, lithium doped potassium sodium niobate (KNLN) having the formula $(K,Na)_{1-t}Li_tNbO_3$, in which the variable 't' ranges from greater than 0.01 to less than 1 (0.01<t<1.00), potassium sodium niobate $(K,NaNb)O_3$ (KNN), or combinations thereof. In some example embodiments, each of the plurality of piezoelectric filler particles is a lithium doped potassium sodium niobate (KNLN) having the formula $(K,Na)_{1-t}Li_tNbO_3$, in which the variable 't' ranges from greater than 0.01 to less than 1 (0.01<t<1.00). In some example embodiments, each of the plurality of piezoelectric filler particles is represented by the formula $K_{0.485}Na_{0.485}Li_{0.03}NbO_3$ in which the variable 't' equals 0.03.

The plurality of piezoelectric filler particles may have a particle size distribution $D_{50}$(μm) ranging from about 3 to about 50, alternatively from about 4 to about 20, or alternatively from about 10 to about 15, and/or $D_{90}$(μm) ranging from about 10 to about 500, from about 20 to about 100. The expression "particle size distribution" as used throughout this disclosure refers to the number of particles that fall into each of the various size ranges given as a percentage of the total number of all sizes in the sample of interest. The parameter "$D_{90}$" signifies the point in the size distribution, up to and including which, 90% of the total volume of material in the sample is contained. For example, if the parameter "$D_{90}$" is 844 microns, it signifies that 90% of the sample has a size of 844 microns or smaller. Similarly, the parameter "$D_{50}$" signifies the point in the size distribution, up to and including which, 50% of the material is contained, and the parameter "Dio" signifies the point in the size distribution, up to and including which, 10% of the material is contained. The particle size distribution can be measured by any of the known techniques typically employed in the industry for such measurements, such as a laser diffraction technique or a dynamic light scattering technique. The piezoelectric filler particles may have suitable size and morphology for piezoelectric application.

One example method of preparing piezoelectric ceramic filler includes: (a) adding a mixture of metal precursor compounds in an organic solvent and forming a suspension, (b) subsequently, homogenizing the suspension followed by filtration and drying in an oven at a temperature of at least 100 degrees C. to remove the solvent and forming a metal salt mixture composition, and (c) loading the metal salt mixture composition so formed on to an alumina crucible and subjecting the metal salt mixture composition to a first calcination step and subsequently to a second calcination step and forming the piezoelectric filler particles. The filler particles once calcined, may be grinded using a mortar and pestle. The first calcination step may involve the step of heating the metal salt mixture composition at a heating rate of about 5° C./min and subsequently may be ramped up to a temperature of at least 1000 degrees C. The temperature may be maintained for a time period of at least 3 hours and thereafter the metal salt mixture composition may be cooled down to a temperature of at least 30 degrees C. at a cooling rate of about 5° C./min. The second calcination step is similar to the first calcination step except, that the heating of the powder sample may be carried out to a temperature of at least 950° C. and at a heating rate of 1° C./min. Then, the temperature may be maintained for at least 10 hours. The metal precursor compounds that may be used for the purpose of preparing the piezoelectric filler particles, can be metal carbonates such as sodium or potassium carbonates, or metal oxides such as niobium oxide.

In some embodiments, a film may include the piezoelectric composite according to any of the described embodiments. A method of preparing such a film containing the piezoelectric composite may include the steps of: (a) dissolving an olefin copolymer in an organic solvent and forming an olefin copolymer solution; (b) adding a plurality of piezoelectric filler particles to the olefin copolymer solution and forming a film precursor; (c) casting the film precursor on a substrate followed by drying, and forming a casted film precursor; and (d) poling the casted film precursor and forming the piezoelectric composite film. A film containing the piezoelectric composite may be prepared without secondary processing, unlike instances where PVDF-based films are subjected to uniaxial stretching and/or surface treatment to induce piezoelectric property. In some embodiments, the process may be solvent-less and include the step of mixing the olefin copolymer and the piezoelectric filler particles, followed by compression molding. The mixture obtained may be subjected to annealing and poling.

In some embodiments, the substrate is a glass plate. Non-limiting examples of organic solvent used for preparing the film include 1,2-diclorobenzene, 1,2,4-triclorobenzene, cyclohexane, toluene, xylene, or combinations thereof. The olefin copolymer to organic solvent ratio may range between 1:5 to 1:15, 1:6 to 1:9, or about 1:8. In some embodiments, the solution includes at least any one of, equal to any one of, or between any two of 10 wt. %, 20 wt. %, 30 wt. %, 40 wt. %, or 50 wt. %, or about 12.5 wt. %, with regard to the olefin copolymer solution.

In some embodiments, casting of the film precursor can include placing the film precursor on a substrate. Non-limiting examples of casting include air casting (e.g., the film precursor can be passed under a series of air flow ducts that controls the evaporation of the organic solvents in a particular set period of time such as 24 to 48 hours), solvent, or emersion casting, (e.g., the film precursor is spread onto a moving belt and run through a bath or liquid in which the liquid within the bath exchanges with the organic solvent). The spreading of the film precursor on the substrate can be carried out with a doctor blade, rolling spreader bar or any such suitable apparatus.

In some embodiments, the casted film is dried at any temperature between 25 degrees C. to 80 degrees C., alternatively between 45 degrees C. to 70 degrees C. to remove the organic solvent and forming the casted film precursor. The casted film precursor may be annealed prior to poling. The annealing of the film may be carried out at any temperature between 80 degrees C. to 150 degrees C. for a time period ranging from 1 hour to 50 hours, preferably annealing the film at a temperature of 110 degrees C. for a time period between 5 hours to 25 hours.

The expression "poling" as used throughout this disclosure means a process of inducing electric polarization in a material to specifically orient the piezoelectric filler particles. During electric polarization, the piezoelectric filler particles may be connected to one another in a linear or semi-linear manner (e.g., chains of particles). Columns of piezoelectric particles are suitably formed by the stacking or aligning of more than one chain. By way of example, the casted film precursor may be poled with a selected electric field at room temperature (e.g., after cooling of the composite), or at a selected electric field at a selected temperature, at least one of the selected electric field. The selected temperature may for example be chosen in accordance with the transition temperature (Tg/Tm) of the polymer matrix and Curie temperature of the piezoelectric filler. In some instance, the poling may occur over a "range" (e.g., selected range) of temperatures rather than at a specific constant temperature. The applied voltage level parameter for the poling can be selected in various ways. For example, the applied voltage level parameter can be selected as constant, or changing (e.g., ramped) over a period of time. In some embodiments, poling is performed using corona discharge in a corona polarization instrument having an electrode gap of 0.5 to 1.5 cm, or preferably about 1 cm for a desired amount of time. According to the disclosure, such a poling technique is referred as 'Corona Poling'.

In some embodiments, the casted film precursor is poled at an electric field ranging from about 5 kV/mm to about 100 kV/mm, alternatively from about 10 kV/mm to about 80 kV/mm, or alternatively from about 20 kV/mm to about 60 kV/mm, for a time period ranging from about 1 minute to about 120 minutes, alternatively from about 20 minutes to about 100 minutes, or alternatively from about 50 minutes to about 80 minutes, and at a temperature ranging from about 60 degrees C. to about 120 degrees C., or alternatively from about 70 degrees C. to about 100 degrees C. The temperature for performing the poling may be conducted in accordance with the transition temperature (Tg/Tm) of the polymer matrix and Curie temperature of the piezoelectric filler.

Films comprising the piezoelectric composite of the described embodiments demonstrate excellent piezoelectric properties by way of demonstrating high values of piezoelectric charge constant ($d_{33}$ (pC/N)) while retaining suitable mechanical flexibility. In some embodiments, the film has a piezoelectric charge constant ($d_{33}$ (pC/N)) ranging from about 2 to about 100, alternatively ranging from about 15 to about 80, or alternatively ranging from about 40 to about 60. The expression "pC/N" denotes picocoulomb per Newton and signifies the mechanical strain generated by a piezoelectric film per unit of electric field applied, or, alternatively, the charge generated by the film per unit of mechanical stress applied. The piezoelectric charge constant can be measured by a suitable piezometer such as a d33 meter. A high value of $d_{33}$ signifies excellent piezoelectric property as the amount of charge generated per unit of mechanical stress applied to the film is high, indicating higher sensitivity and therefore suitable for piezoelectric sensors and devices.

Another characteristic of the films is the piezoelectric voltage constant (g33 (mV-m/N)) ranging from 50 to 400, alternatively from 80 to 300, or alternatively from 120 to 250. The piezoelectric voltage constant signifies the electric field generated by a piezoelectric material per unit of mechanical stress applied or, alternatively, is the mechanical strain experienced by a piezoelectric material per unit of electric displacement applied. As may be appreciated by a skilled person in the art, the film comprising the piezoelectric composite of the present disclosure, demonstrates high piezoelectric voltage constant (g33 (mV-m/N)) signifying high sensitivity towards piezoelectric application used in piezo sensors. The value of piezoelectric voltage constant (g33 (mV-m/N)) is obtained by the formula: ($d_{33}/\varepsilon$), where $d_{33}$ is the piezoelectric charge constant and '$\varepsilon$' is the dielectric constant. The film may have a piezoelectric charge constant ($d_{33}$ (pC/N)) ranging from about 2 to about 100, and a piezoelectric voltage constant ($g_{33}$ (mV-m/N)) ranging from about 50 to about 400.

In some embodiments, the film has a thickness ranging from 50 microns to 500 microns, alternatively a thickness ranging 60 microns to 400 microns, or alternatively a thickness ranging from 100 microns to 250 microns. A film containing the piezoelectric composite has a tensile strength ranging from 2 MPa to 7.5 MPa when determined in accordance with ASTM, D882 which is suitable for specific article of manufacture application.

In some embodiments, the film has elongation at break ranging from about 20% to 800%.

In some embodiments, the film containing the piezoelectric composite of the present disclosure, is present in an article of manufacture. In some embodiments of the disclosure, the article of manufacture is a component of a touch panel, a human machine interface, an integrated keyboard, or a wearable device. Polymer composites according to aspects of the disclosure may be deposited on substrates as thin film and formed into piezoelectric devices. In some embodiments, the polymer composite is a mechanically flexible thin film formed on a flexible substrate as part of the manufacture of flexible electronic devices. An elongation-at-break value (in percent) may be used to demonstrate mechanical flexibility of materials. In some embodiments, the elongation-at-break (in percent) of the piezoelectric composite film is greater than 25%. Such electronic devices may include a piezoelectric sensor configured to generate an analog signal proportional to an amount of deflection applied to the piezoelectric sensor by a user. The piezoelectric sensor could be integrated in a mobile device for receiving user input for controlling the mobile device. In one example of a wearable medical device, the mechanical vibrations of body organs, such as a heartbeat, can be converted into electrical signals and transmitted via Bluetooth, wi-fi, or other signal to a smartphone or other computing device. In another example use of a piezoelectric material, the material may be used as a transducer to convert signals for output, such as by configuring the piezoelectric as a speaker or buzzer to convert signals to audible sounds. In yet another example use of a piezoelectric material, the material may be transparent and incorporated into an electronic display to create a touch-screen device that can display information to a user and receive user feedback on the displayed information through taps on the screen.

Accordingly, embodiments that describe piezoelectric composites and films containing such piezoelectric composites may have one or more benefits of ease of processability, excellent piezoelectric characteristics while retaining suitable flexibility, and/or mechanical property. As shown in the examples below, the piezoelectric composite and films containing such piezoelectric composite demonstrates piezoelectric properties with a balance between piezoelectric charge constant and piezoelectric voltage constant.

Specific examples demonstrating some embodiments of the disclosure are included below. The examples are for illustrative purposes only and are not intended to limit the disclosure. The embodiments and the aspects disclosed herein are not mutually exclusive and such aspects and embodiments can be combined in any way. Those of ordinary skill in the art will readily recognize parameters that can be changed or modified to yield essentially the same results.

Examples

A method of preparing a piezoelectric composite may include: (a) dissolving an olefin copolymer in an organic solvent and forming a olefin copolymer solution; (b) adding a plurality of piezoelectric filler particles to the olefin copolymer solution and forming a film precursor; (c) casting the film precursor on a substrate followed by drying and forming a casted film precursor; and (d) poling the casted film precursor and forming the piezoelectric film.

In more detail, olefin copolymer resin was dissolved in toluene. The desired amount of filler was then added slowly under stirring at 200-250 rpm using a magnetic stirrer. After stirring for 30-60 minutes, the mixture was casted into a thin film using a doctor blade onto a substrate, followed by drying in open air. The drying time was adjusted depending on the blade gap used for making the composites. After drying, the films were peeled off from the glass plate and annealed under nitrogen. Very good quality films are obtained. The compositions of the piezoelectric polymer composite prepared following the procedure mentioned above are provided in Table 1.

Dielectric Property

For electrical measurements, circular gold electrodes, 20 and 10 mm diameter, were deposited on both sides of the composite films using sputter coater. The film was sandwiched between the electrodes and mounted in the sample cell. The dielectric constant was measured at room temperature with Alpha A High Frequency Dielectric/Impedance Analyzer (Frequency range: 100 Hz-1 MHz).

Dielectric constant was measured at various frequencies, for piezoelectric composite comprising olefin copolymer and 45 vol. % KNLN. The results are shown in FIG. 2.

Piezoelectric Response

The piezocomposite films (3 cm×3 cm) were subjected to Corona Poling for the demonstration of piezoelectric response. Corona poling of the piezocomposites was carried out under the conditions detailed below; the needles were kept at high electric field (typically 100 kV/nm), poling temperature was ~70° C., the electrode gap was 1 cm and poling time was 1 h. The samples were cooled to room temperature under the same applied voltage. The poled films were kept for at least 24 hours and then the piezoelectric strain constant ($d_{33}$) of the poled films was measured at ambient temperature using Berlin court type $d_{33}$ meter, (PM300, Piezo Test, UK) at the frequency of 110 Hz, clamping force of ION and oscillatory force 0.25N. The piezoelectric strain constant was also measured as a function of temperature. Poled PVDF and piezocomposite films were kept at a pre-defined temperature in an oven for one hour and then cooled to room temperature before the measurement of d33. The piezoelectric data were acquired in 20° C. temperature interval (60, 80, 100, 120, 140, 160, 180 and 200° C.).

Mechanical Property

The tensile properties of the composite films were measured at room temperature with Universal Tensile machine according to ASTM D882, at a cross head speed of 500 mm/min. The results of this testing is shown in FIG. 4.

Three different olefin copolymers were selected that were ethylene-octene copolymers, having different octene content (12, 18 and 35 wt. %) as the polymer matrix for fabricating piezoelectric polymer composites. Different olefin copolymers having distinctly different properties are shown in Table 2. It can be seen that the thermal transition temperatures (Tg and Tm) and modulus of the olefin copolymers decrease significantly with increasing octene content. The influence of octene content of olefin copolymer on piezoelectric strain constant, $d_{33}$ for piezoelectric polymer composite (Example 2, 6, 7) is summarized in Table 1. FIG. 2 shows the dependence of the dielectric constant on frequency for Example 2. The dielectric constant of the composite film at 100 Hz was 18 and the piezoelectric voltage constant, g33 was determined to be ~276 mV·m/N. FIG. 3*a* compares the temperature dependence of piezoelectric strain constant for poled PVDF and piezocomposite (Example 2). FIG. 3*b* shows the effect of temperature on the physical appearance of both the films. It is evident that the piezocomposite shows higher piezoelectric constant than PVDF within the entire range of temperatures studied. The physical appearance of the piezocomposite film does not change even after heating at 200° C., in contrast a pale brown color develops in PVDF film which was then subjected to the heat treatment under same condition. For majority of the practical applications, it is required that the piezoelectric material should be stable within the operational temperature range of the device. This result indicates that operating temperature range of polyolefin based piezocomposite is higher as compared to piezoelectric PVDF. The stress-strain curve for Example 2 is shown in FIG. 4. The composite film having 45 vol. % KNLN loading showed 433% elongation at break with a noticeable increase in modulus to 57 MPa from 3 MPa with parent polymer.

Comparison of examples 1, 2 and 3 (Table 1) shows effect of KNLN volume percent on d33 of piezoelectric polymer composite. A steep increase in d33 was observed with increasing KNLN loading from 25 to 45 volume percent. Example 2, 4 and 5 demonstrate piezoelectric composite compositions containing ethylene-octene copolymer (35 weight percent octene) and three different fillers, KNLN (Example 2), barium titanate (BT) (Example 4) and lead zirconate titanate (PZT) (Example 5). Our studies indicate that d33 values of piezoelectric composites can be tailored by suitably choosing the appropriate amount of filler, particle size and size distribution of filler, appropriate solvent for making the piezocomposite etc.

TABLE 1

Piezoelectric polymer composite compositions

| Example no | Polymer matrix (random copolymer) | Piezoceramic Filler | Filler loading (vol %) | d33 (pC/N) |
|---|---|---|---|---|
| 1 | olefin copolymer , 35 wt. % octene | KNLN | 60 | 46.4 |
| 2 | olefin copolymer , 35 wt. % octene | KNLN | 45 | 42.7 |
| 3 | olefin copolymer , 35 wt. % octene | KNLN | 25 | 18 |
| 4 | olefin copolymer , 35 wt. % octene | BT | 45 | 23.5 |
| 5 | olefin copolymer , 35 wt. % octene | PZT | 45 | 27 |
| 6 | olefin copolymer , 18 wt. % octene | KNLN | 45 | 11.1 |
| 7 | olefin copolymer , 12 wt. % octene | KNLN | 45 | 6.2 |

TABLE 2

Physical properties of polymers as matrix

| POLYMER DETAIL | Mn, Mw | Density (g/cm3) | Tg (° C. ) | Tm (° C. ) | Modulus (GPa) |
|---|---|---|---|---|---|
| olefin copolymer, 35 wt. % octene | 28098, 107725 | 0.87 | −52 | 62 | 0.003 |
| olefin copolymer, 18 wt. % octene | | 0.9 | −31 | 98 | 0.068 |

TABLE 2-continued

| Physical properties of polymers as matrix | | | | | |
|---|---|---|---|---|---|
| POLYMER DETAIL | Mn, Mw | Density (g/cm3) | Tg (° C.) | Tm (° C.) | Modulus (GPa) |
| olefin copolymer, 12 wt. % octene | | 0.92 | — | 112 | 0.136 |

Thus, a superior piezoelectric composite and film made from the composite are herein disclosed.

We claim:

1. A piezoelectric composite, comprising:

an olefin copolymer comprising a first monomer of ethylene or propylene, polymerized with any of 1-butene, 4-methyl-1-pentene,1-hexene, 1-octene, 1-decene, 1-dodecene, 1-tetradecene, 1-hexadecene, 1-octadecene, and 1-eicosene; and a plurality of piezoelectric filler particles dispersed in the olefin copolymer, wherein the olefin copolymer is an ethylene-octene copolymer represented by the general formula:

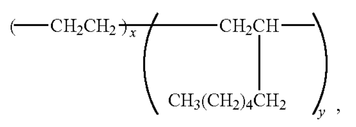

wherein the ethylene-octene copolymer comprises from 10 to 40 wt. % octene.

2. The piezoelectric composite of claim 1, wherein the olefin copolymer is present in an amount ranging from 20-80 vol. %, with regard to the total volume of the piezoelectric composite.

3. The piezoelectric composite of claim 1, wherein the plurality of piezoelectric filler particles is present in an amount ranging from 20-80 vol. %, with regard to the total volume of the piezoelectric composite.

4. The piezoelectric composite of claim 1, further comprising at least one of polyethylene, polypropylene, ethylene copolymer, propylene copolymer, polyethylene terephthalate (PET), polycarbonate (PC), polybutylene terephthalate (PBT), poly(41,-cyclohexylidene cyclohexane-41,-dicarboxylate) (PCCD), glycol modified polycyclohexyl terephthalate (PCTG), poly(phenylene oxide) (PPO), polypropylene (PP), polyethylene (PE), polyvinyl chloride (PVC), polystyrene (PS), polymethyl methacrylate (PMMA), polyethyleneimine or polyetherimide (PEI) and their derivatives, thermoplastic elastomer (TPE), terephthalic acid (TPA) elastomers, poly(cyclohexanedimethylene terephthalate) (PCT), polyethylene naphthalate (PEN), polyamide (PA), polysulfone sulfonate (PSS), polyether ether ketone (PEEK), acrylonitrile butyldiene styrene (ABS), polyether ketone ketone (PEKK), polyphenylene sulfide (PPS), co-polymers thereof, or blends thereof.

5. The piezoelectric composite of claim 1, wherein the plurality of piezoelectric filler particles comprise at least one of lead zirconate titanate (PZT), hydroxyapatite, apatite, lithium sulfate monohydrate, sodium bismuth titanate, quartz, tartaric acid fibers, poly(vinylidene fluoride) fibers, barium titanate, lithium doped potassium sodium niobate (KNLN) having the formula $(K,Na)_{1-t}Li_tNbO_3$ wherein the variable ‘t’ ranges from greater than 0.01 to less than 1 ($0.01<t<1.00$), potassium sodium niobate $(K,NaNb)O_3$ (KNN), or combinations thereof.

6. The piezoelectric composite of claim 1, wherein the plurality of piezoelectric filler particles comprises about 40 vol % to about 60 vol % of KNLN, with regard to the total volume of the piezoelectric composite.

7. A film comprising the piezoelectric composite of claim 1.

8. The film of claim 7, wherein the film has a piezoelectric charge constant ($d_{33}$ (pC/N)) ranging from about 6 to about 100.

9. The film of claim 7, wherein the piezoelectric voltage constant (g33 (mV·m/N) is ~100-300.

10. The film of claim 7, wherein the film has a thickness ranging from about 50 microns to about 500 microns.

11. A method of preparing the film of claim 7, wherein the method comprises:

dissolving an olefin copolymer in an organic solvent and forming an olefin copolymer solution, the olefin copolymer comprising a first monomer of ethylene or propylene, polymerized with any of 1-butene, 4-methyl-1-pentene,1-hexene, 1-octene, 1-decene, 1-dodecene, 1-tetradecene, 1-hexadecene, 1-octadecene and 1-eicosene;

adding a plurality of piezoelectric filler particles to the olefin copolymer solution and forming a film precursor;

forming a casted film precursor from the film precursor; and poling the casted film precursor wherein the olefin copolymer is an ethylene-octene copolymer represented by the general formula:

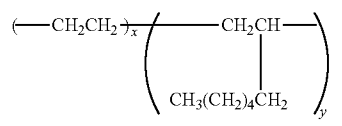

wherein the ethylene-octene copolymer comprises from 10 to 40 wt. % octene.

12. The method of claim 11, wherein the casted film precursor is annealed prior to poling.

13. The method of claim 11, wherein the casted film precursor is poled at an electric field ranging from about 5 kV/mm to about 100 kV/mm for a time period ranging from about 1 minute to about 120 minutes and at a temperature ranging from about 60 degrees Celsius to about 120 degrees Celsius.

* * * * *